(12) United States Patent
Rathnam et al.

(10) Patent No.: US 6,822,879 B2
(45) Date of Patent: Nov. 23, 2004

(54) EMBEDDED ELECTROMAGNETIC INTERFERENCE SHIELD

(75) Inventors: Lakshman Rathnam, Mountain View, CA (US); Herbert Kraus, Orange, CA (US); Dubravko Babic, Palo Alto, CA (US)

(73) Assignee: Emcore Corporation, Somerset, NJ (US)

( * ) Notice: Subject to any disclaimer, the term of this patent is extended or adjusted under 35 U.S.C. 154(b) by 0 days.

(21) Appl. No.: 10/213,540

(22) Filed: Aug. 6, 2002

(65) Prior Publication Data

US 2004/0027818 A1 Feb. 12, 2004

(Under 37 CFR 1.47)

(51) Int. Cl.[7] .................................................. H05K 9/00
(52) U.S. Cl. ...................... 361/818; 361/800; 361/816; 714/35; 714/51 R; 439/939; 439/607
(58) Field of Search ................................. 361/818, 816, 361/800, 753, 787; 174/35, 51 R; 439/607, 939

(56) References Cited

U.S. PATENT DOCUMENTS

| | | | |
|---|---|---|---|
| 5,204,496 A | * | 4/1993 | Boulay et al. ......... 174/35 GC |
| 5,546,281 A | | 8/1996 | Poplawski et al. |
| 5,566,052 A | * | 10/1996 | Hughes ....................... 361/704 |
| 5,734,558 A | | 3/1998 | Poplawski et al. |
| 5,757,098 A | | 5/1998 | Higuchi et al. |
| 5,766,041 A | * | 6/1998 | Morin et al. ................ 439/609 |
| 5,767,999 A | | 6/1998 | Kayner |
| 5,857,049 A | | 1/1999 | Beranek et al. ................ 385/91 |
| 5,879,173 A | | 3/1999 | Poplawski et al. |
| 5,901,263 A | | 5/1999 | Gaio et al. |
| 5,954,540 A | * | 9/1999 | Wu ............................ 439/607 |
| 5,966,487 A | | 10/1999 | Gilliland et al. |
| 6,085,006 A | | 7/2000 | Gaio et al. |
| 6,179,627 B1 | | 1/2001 | Daly et al. |
| 6,201,704 B1 | | 3/2001 | Poplawski et al. |
| 6,203,333 B1 | | 3/2001 | Medina et al. |
| 6,213,651 B1 | | 4/2001 | Jiang et al. |
| 6,220,878 B1 | | 4/2001 | Poplawski et al. |
| 6,267,606 B1 | | 7/2001 | Poplawski et al. |
| 6,299,362 B1 | | 10/2001 | Gilliland et al. |
| 6,304,436 B1 | | 10/2001 | Branch et al. |
| 6,318,908 B1 | | 11/2001 | Nakanishi et al. |
| 6,335,869 B1 | | 1/2002 | Branch et al. |
| 6,347,954 B1 | | 2/2002 | Jones et al. |
| 2002/0181526 A1 | | 12/2002 | Gao ............................ 372/45 |

* cited by examiner

*Primary Examiner*—Tulsidas Patel
*Assistant Examiner*—Hung S. Bui
(74) *Attorney, Agent, or Firm*—Sawyer Law Group LLP

(57) ABSTRACT

An improved electromagnetic interference shield for a module includes springs in which the compression force pushes the springs in a direction that is approximately parallel to the optic axis. The springs allow significantly looser tolerances on the placement of the module on its associated printed circuit board. The shield also includes an opening near its center, the edge of which includes a plurality of teeth. When the shield is placed onto the module, the teeth bend along the negative optic axis direction and prevent the shield from being pulled away from the module. Accidental removal of the shield is thus prevented. The shield splits the enclosure ground from the internal signal ground, decreasing the capacitance between them, in turn decreasing another possible source of electromagnetic radiation. In addition, the shield is more cost efficient to manufacture since it only requires a one step assembly process.

17 Claims, 7 Drawing Sheets

EMBEDDED ELECTROMAGNETIC INTERFERENCE SHIELD

FIELD OF THE INVENTION

The present invention relates to electromagnetic interference shields, and more particularly to such shields for fiber-optic modules.

BACKGROUND OF THE INVENTION

The need for electromagnetic interference (EMI) shielding in fiber-optic modules is well known in the art. Typically, the fiber-optic module resides on the end of a printed circuit board and protrudes through a metallic enclosure that encloses the board and the fiber-optic module. The enclosure's faceplate comprises openings, through which a fiber-optic connector can couple to the fiber-optic module. The electronic components on the circuit board and the fiber-optic module generate electromagnetic (EM) radiation. Since high powers of EM radiation may pose a health hazard, the amount of radiation that is allowed to leak out of such enclosures is limited by government regulations. Typically, without special care, the gaps between the fiber-optic module and the enclosure opening tend to allow unacceptable amounts of electromagnetic radiation generated in the enclosure to leak through. Thus it is well know in the art that an electromagnetic interference (EMI) shield placed around the fiber-optic module is necessary to close these gaps and prevent high EM radiation levels from leaking from the enclosure. The EMI shield is made out of conductive material and couples the fiber-optic module with the enclosure to prevent the EMI radiation from leaking through the gaps and to electrically ground the fiber-optic module.

FIG. 1 illustrates a conventional EMI shield and module. The conventional EMI shield 100 comprises a sheet of metal folded around the housing 104 of the module. The shield 100 comprises a plurality of springs 102 which would contact the enclosure faceplate 106 at its opening 108. This contact grounds the module 104 and prevents EMI radiation from leaking through the gap between the module 104 and the enclosure faceplate 106, reducing EMI radiation leakage. It is well know that that for proper EM shielding, the gaps between the contact points of the springs 102 and the enclosure faceplate 106 must be small for efficient shielding.

There are several disadvantages of the prior art. The use of springs 102 that have the compression force that pushes outward from the module 100 along the x and the y-axes, i.e., parallel with the enclosure faceplate 106, requires the springs 102 and the enclosure opening 108 to have a tight tolerance. The reason is that the module 104 and the printed circuit board on which the module is mounted must be precisely placed in the enclosure opening 108 to realize adequately uniform pressure on all springs 102 to ensure proper contact between the shield 100 and the enclosure faceplate 106. Furthermore, the shield 100 is costly to manufacture as it requires multiple manufacturing steps. The metal is first cut to form a flat pattern of the shield 100, including a plurality of fingers. The fingers are then bent to form the springs 102. The flat pattern is then folded to fit over the module 104. Additionally, to realize springs with sufficient compression force to make contact with the enclosure 106 necessitates wide springs and ultimately lower density of springs, further limiting the efficiency of the shielding scheme.

Accordingly, there exists a need for an improved EMI shield for fiber-optic modules. The improved EMI shield should have looser tolerance for easier placement of the module and should be less costly to manufacture. The present invention addresses such a need.

SUMMARY OF THE INVENTION

An improved EMI shield for a module includes springs in which the compression force pushes the springs in a direction that is approximately perpendicular to the optic axis. The springs allow significantly looser tolerances on the placement of the module on its associated printed circuit board. The shield also includes an opening near its center, the edge of which includes a plurality of teeth. When the shield is placed onto the module, the teeth bend along the negative optic axis direction and prevent the shield from being pulled away from the module. Accidental removal of the shield is thus prevented. The shield splits the enclosure (chassis) ground from the internal signal ground, decreasing the capacitance between them, in turn decreasing another possible source of electromagnetic radiation. In addition, the shield is more cost efficient to manufacture since it only requires a one step assembly process.

DETAILED DESCRIPTION

The present invention provides an improved EMI shield for fiber-optic modules. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

To more particularly describe the features of the present invention, please refer to FIGS. 2A through 4 in conjunction with the discussion below.

Figure 1:
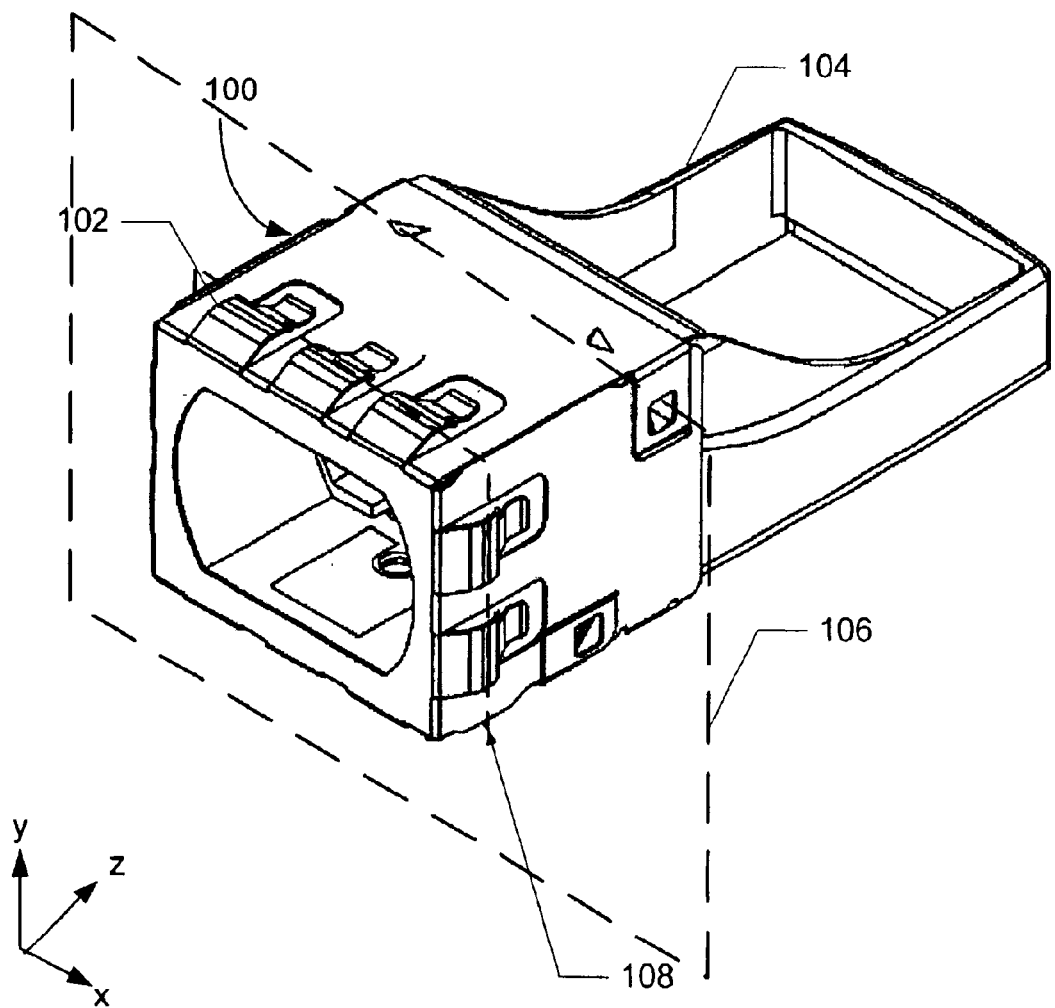
FIG. 1 illustrates a conventional EMI shield and module.
Figure 2A:
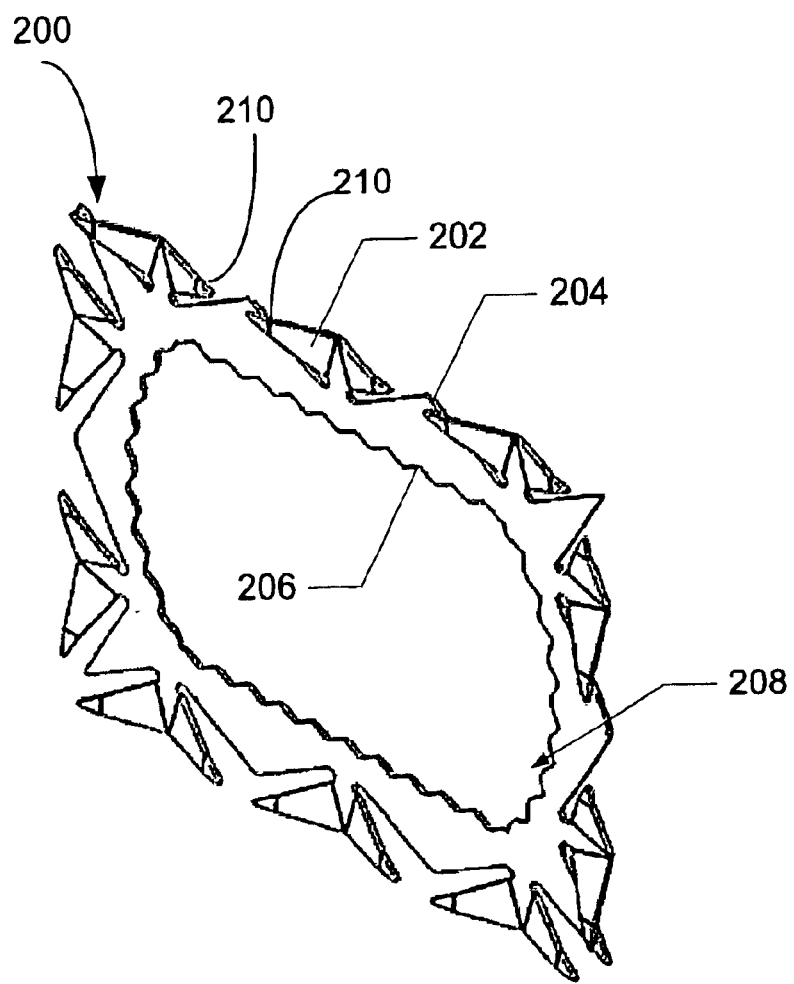
FIGS. 2A–2B illustrate a front perspective view and a back perspective view, respectively, of a preferred embodiment of an EMI shield in accordance with the present invention.
Figure 2A:
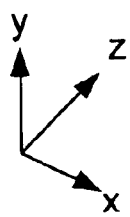
Figure 2B:
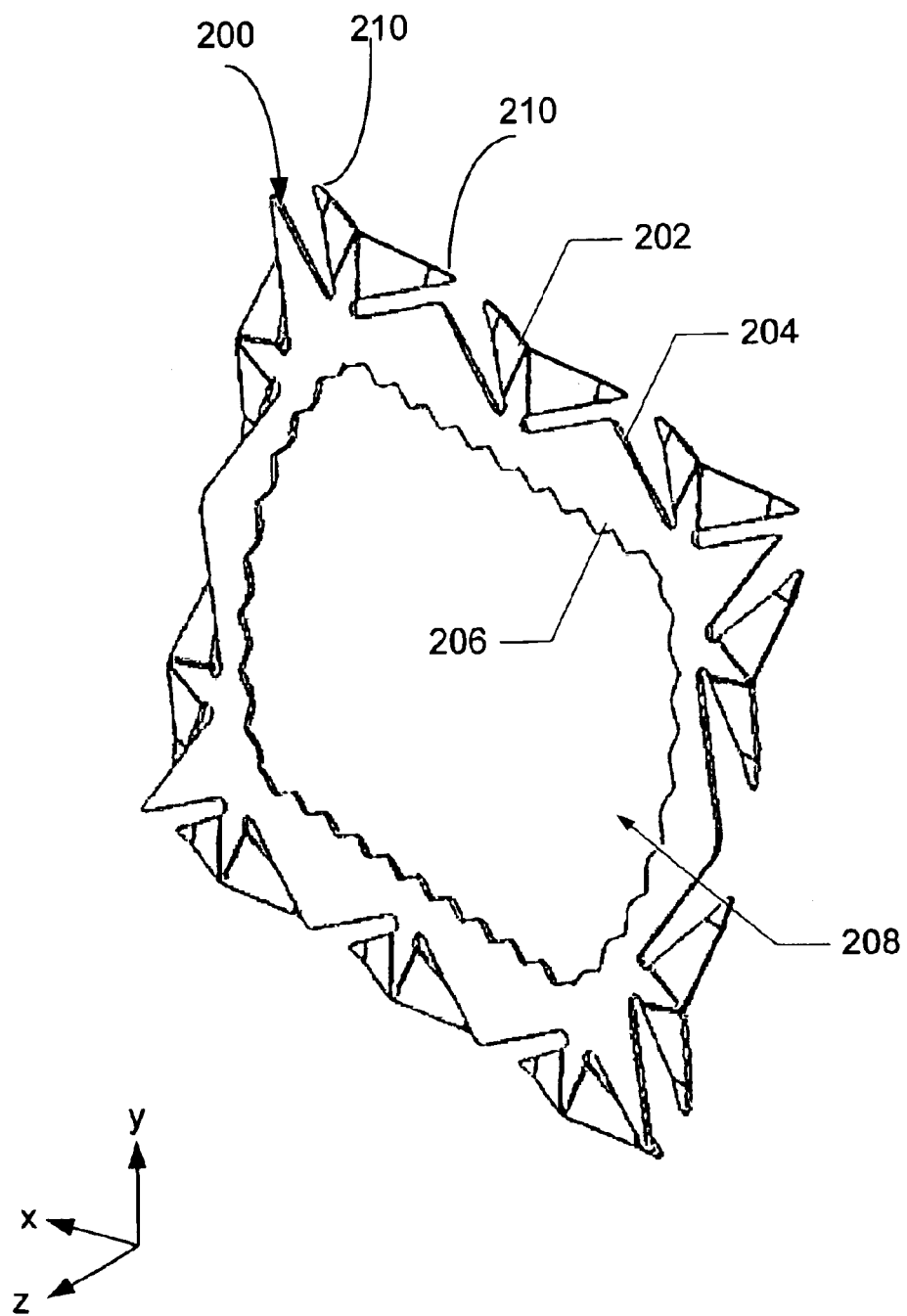

FIGS. 2A–2B illustrate a front perspective view and a back perspective view, respectively, of a preferred embodiment of an EMI shield in accordance with the present invention. The shield 200 comprises metal with an opening 208 near the center. At the outer edges of the shield 200 are a plurality of springs 202 and a plurality of extensions 204. In the preferred embodiment, the tips 210 of the springs 202 are bent along the optic axis, i.e., the z-axis, and would contact the enclosure faceplate. Each extension 204 resides between two springs 202 such that the gap between the two springs 202 is reduced. The extensions 204 also prevent the gap between the two springs 202 from having a horizontal slit shape. As is known to one of ordinary skill in the art, a horizontal slit shape enables easier EMI radiation traversing therethrough. The shield 200 also comprises a plurality of teeth 206 at the edge of the opening 208. The plurality of teeth 206 allows the shield to have a Tinnerman-type hold on the module, as described further below with FIGS. 3 and 4.

Figure 3:
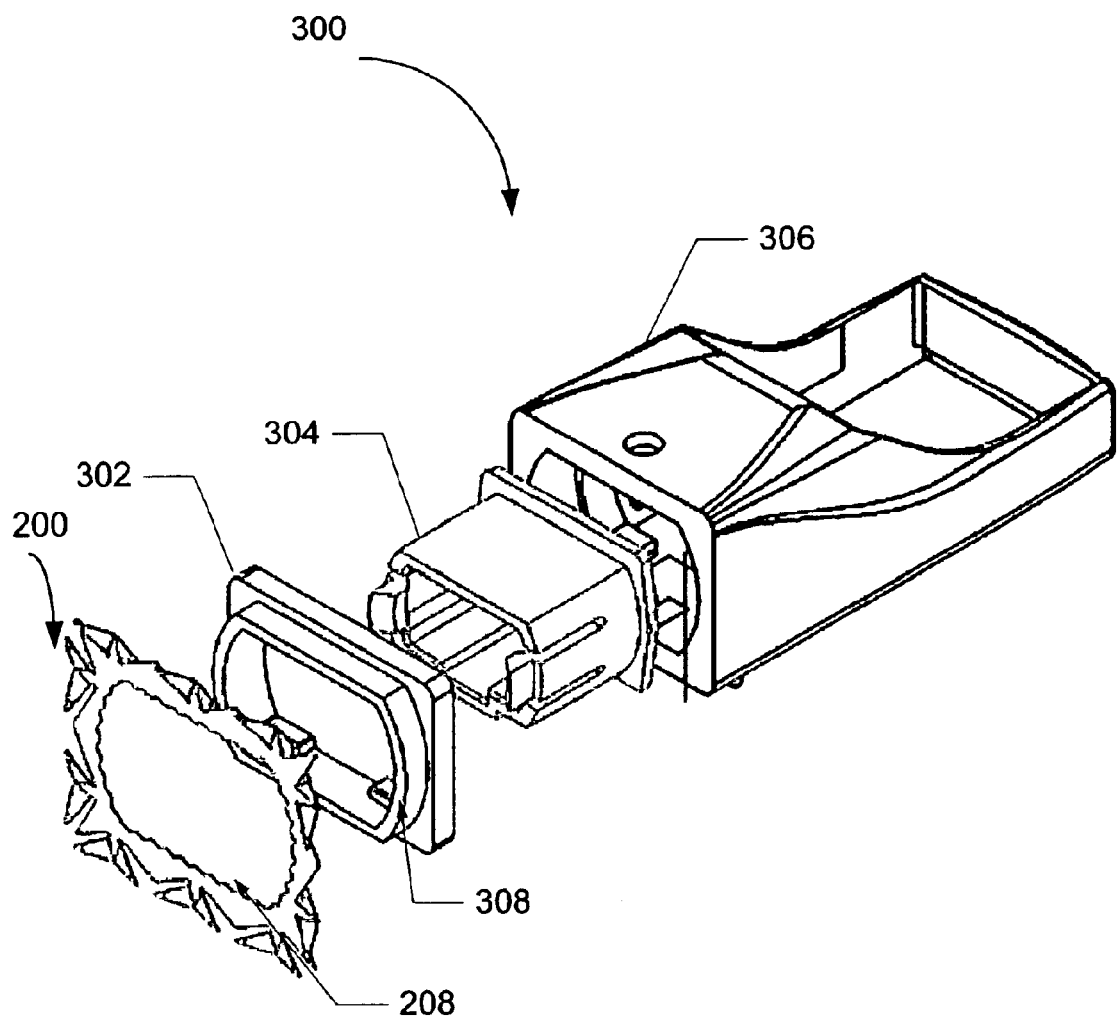
FIGS. 3 and 4A illustrate an exploded perspective view and an assembled perspective view, respectively, of an optical module that utilizes the EMI shield in accordance with the present invention.
Figure 4A:
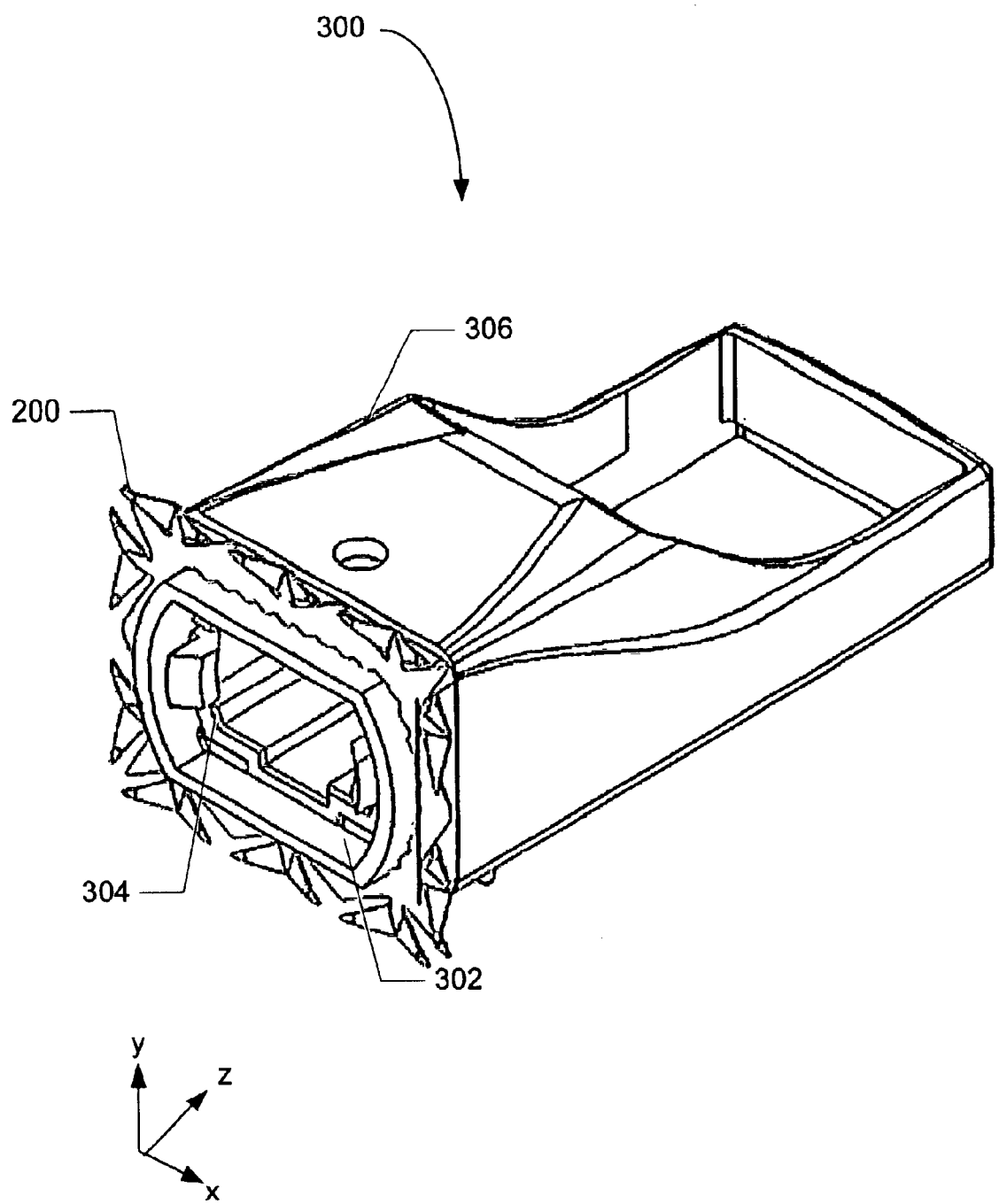

FIGS. 3 and 4A illustrate an exploded perspective view and an assembled perspective view, respectively, of an optical module that utilizes the EMI shield in accordance with the present invention. In the preferred embodiment, the fiber-optic module 300 comprises a housing 306, an adapter 304 within the housing 306 for engaging a connector (not shown) for some type of signal carrying medium such as a fiber optic ferrule, a sleeve 302 coupled to the housing 306, and the shield 200 coupled to the sleeve 302. A lip 308 of the sleeve 302 would reside within the opening 208 of the shield 200. The shield 200 is coupled to the sleeve 302 by sliding the shield 200, with the tips of the springs 202 pointing outward, i.e., away from the module along the z-axis, over the lip 308 of the sleeve 302. The opening 208 in the shield 200 is slightly smaller than the lip 308 of the sleeve 302, so that when the shield 200 is pulled over the lip 308 in this manner, the teeth 206 of the shield 200 are pushed outward along the negative z-axis. Once the shield 200 is in place over the lip 308, the outward bend of the teeth 206 applies pressure and makes the teeth dig into the lip 308. Since under normal mounting, the teeth 206 are bent along the negative z-axis, if the shield 200 were to be pulled away from the sleeve 302, the teeth would dig into the lip 308 even more. This method of coupling is referred to as a "Tinnerman" type of coupling. In this manner, the shield 200 is prevented from being accidentally removed. An alternative embodiment may include a grove (not shown) on the sleeve lip 308 into which the teeth 206 would fall as the shield 200 is placed into position. The grove would prevent the shield 200 from being accidentally removed.

As assembled, the module 300 can now be placed on the printed circuit board near an opening in the enclosure faceplate in such a way that the tips of the springs 202 contact the enclosure faceplate. This connects the module 300 to the electrical ground of the enclosure faceplate.

Figure 4B:
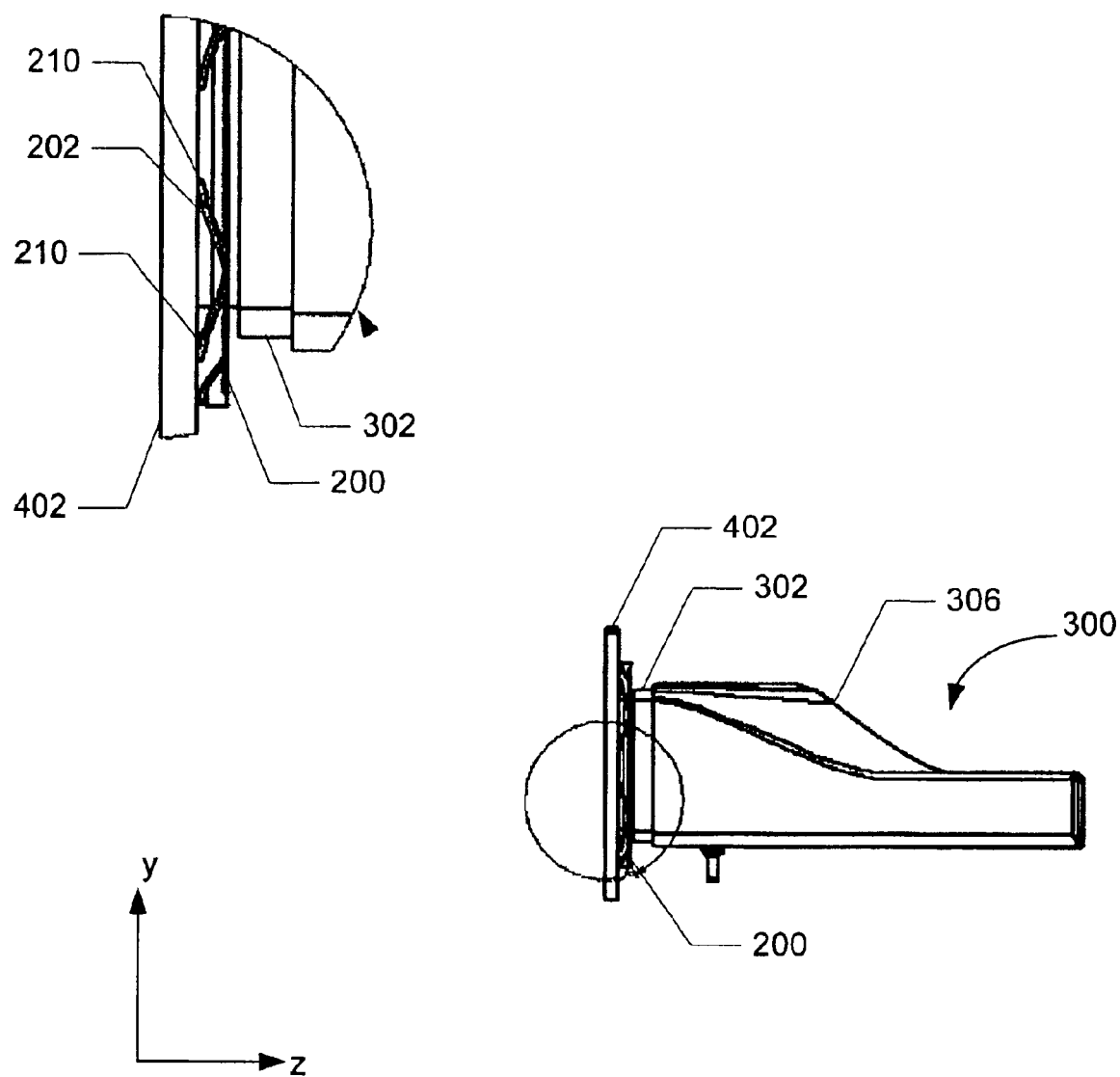
FIG. 4B illustrates a detailed view of the enclosure faceplate with the EMI shield in accordance with the present invention.

FIG. 4B illustrates a detailed view of the enclosure faceplate with the EMI shield in accordance with the present invention. The springs 202 are bent toward the enclosure faceplate 402 in the negative z-axis direction. Their tips 210 contact the enclosure faceplate 402 as shown. Because the springs 202 of the shield 200 contact the enclosure faceplate 402 with a bend along the negative z-axis, the positioning of the fiber-optic module 300, and hence the entire printed circuit board, has a looser tolerance than the conventional shield 100, particularly along the x- and y-axes. This increases the ease of placement of the module 300. The tips 210 of the springs 202 also scrape the surface of the enclosure faceplate 402 when they make contact with it. This scraping removes any oxidation on the faceplate 402, providing a better electrical contact between the shield 200 and the enclosure faceplate 402.

In this embodiment, the shield 200 separates the enclosure faceplate ground and the signal ground internal to the module 300 and the host printed circuit board. Because the shield 200 extends in directions away from the fiber-optic module 300, i.e., along the x- and y-axes rather than along the z-axis as with the conventional shield, the capacitance between the enclosure faceplate ground and the internal signal ground is decreased. This is advantageous because of reduced noise and interference crosstalk between the two grounds.

The shields 200 and 500 are more cost efficient to manufacture than the conventional shield 100. The shields 200 and 500 can each be manufactured with a one step process of cutting or punching the shield 200 from a single sheet of metal. The spring bending can be performed in the same step. Alternatively, the spring bending can be performed in a separate step, and/or the outer edge and the opening 208 can be cut in separate steps.

Figure 5:
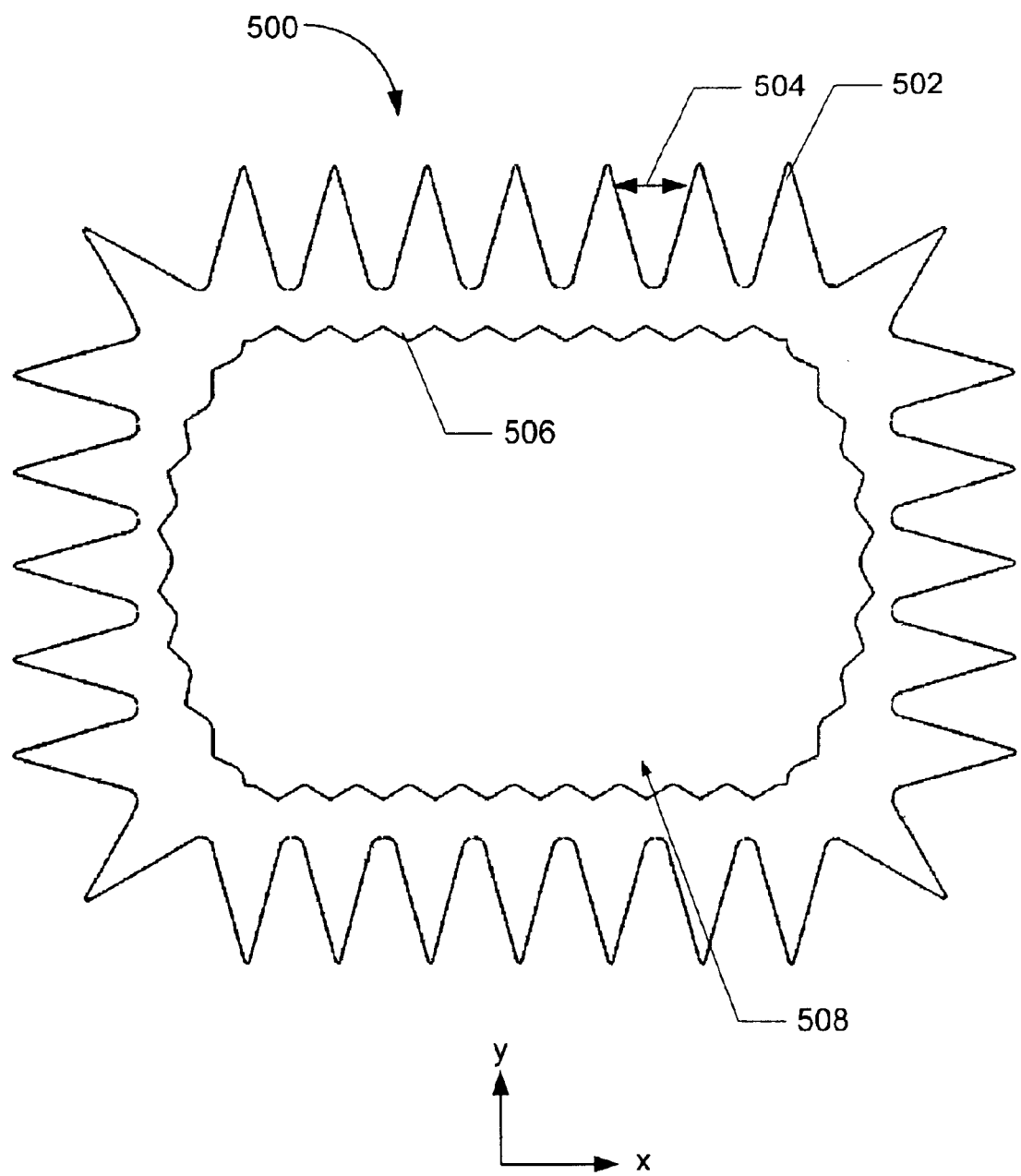
FIG. 5 illustrates an alternative preferred embodiment of an EMI shield in accordance with the present invention.

FIG. 5 illustrates an alternative preferred embodiment of an EMI shield in accordance with the present invention. Similarly to the shield 200, the shield 500 also comprises metal with an opening 508 near the center and a plurality of teeth 506 and springs 502. The springs 502 of the shield 500 have a triangular shape, as illustrated, and its tips would contact the enclosure faceplate. The shield 500 has the advantage of having more numerous springs 502 for contacting the shield 500 and the enclosure faceplate, as compared to the shield 200. The air gap 504 between the springs 502 is now greater than in the shield 200.

A shield with a combination of the springs 202 and 502 may also be used without departing from the spirit and scope of the present invention. Also, in alternative embodiments, the springs 202 and 502 may be bent in alternate directions, such as in the positive and negative z-axis, if contacting two surfaces is necessary.

Although the shield in accordance with the present invention is described above with a fiber-optic module, one of ordinary skill in the art will understand that the shield may be used with any type of module, including electrical modules with electrical wires as the signal-carrying medium, for the purpose of reducing EMI radiation without departing from the spirit and scope of the present invention. When the shield is mounted on an electrical module, the bent tips would bend in a direction approximately perpendicular to the surface of the enclosure faceplate.

An improved EMI shield for fiber-optic modules has been disclosed. The shield comprises a plurality of springs bent outward along the optic axis, which would contact an enclosure faceplate. Because the springs are bent in this manner, the placement of the module has looser tolerance than conventional shields. The shield also comprises an opening near its center, the edge of which comprises a plurality of teeth. When the shield is placed onto the module, the teeth bend outward and would dig into the module, especially if the shield were to be pulled away from the module. In this manner, accidental removal of the shield is prevented. The shield also splits the faceplate ground from the internal signal ground, decreasing the capacitance between them, in turn decreasing another possible source of EMI radiation. In addition, the shield is more cost efficient to manufacture since it only requires a one step assembly process.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An electromagnetic interference (EMI) shield, comprising:

an outer edge, the outer edge comprising a plurality of springs, each of the plurality of springs comprising bent tips;

an opening proximate to a center of the shield, the opening comprising a plurality of teeth at an edge of the opening, wherein the plurality of teeth is configured to contact a module; and a plurality of extensions at the outer edge, wherein each extension resides between two of the plurality of springs, wherein the extensions reduce gaps between the springs.

2. The shield of claim 1, wherein the plurality of teeth are configured to provide a Tinnerman-type coupling with the module.

3. The shield of claim 1, wherein the shield is comprised of a sheet of metal.

4. The shield of claim 1, wherein the bent tips contact an enclosure faceplate when the module resides on a printed circuit board.

5. The shield of claim 1, wherein the bent tips comprise a spring force in a direction approximately parallel to an optic axis.

6. The shield of claim 1, wherein the module is a fiber-optic module.

7. The shield of claim 1, wherein the module is an electrical module.

8. A module, comprising:

a housing;

an adapter residing within the housing for engaging a connector for a signal carrying medium;

a sleeve coupled to the adapter; and an electromagnetic interference shield, comprising:

an outer edge, the outer edge comprising a plurality of springs, each of the plurality of springs comprising bent tips, an opening proximate to a center of the shield, the opening comprising a plurality of teeth at an edge of the opening, wherein the plurality of teeth couple the shield to the sleeve, and a plurality of extensions at the outer edge wherein each extension resides between two of the plurality of springs.

9. The module of claim 8, wherein the plurality of teeth provide a Tinnerman-type coupling with the sleeve.

10. The module of claim 8, wherein the shield is comprised of a sheet of metal.

11. The module claim 8, wherein the bent tips contact an enclosure faceplate when the module resides on a printed circuit board.

12. The module of claim 8, wherein the bent tips comprise a spring force along a direction approximately parallel to an optic axis.

13. The module of claim 8, wherein the extensions reduce gaps between the springs.

14. The module of claim 8, wherein the module is a fiber-optic module.

15. The module of claim 14, wherein the signal-carrying medium comprises optical fibers.

16. The module of claim 8, wherein the module is an electrical module.

17. The module of claim 16, wherein the bent tips comprise a spring force along a direction approximately perpendicular to a surface of an enclosure faceplate.

\* \* \* \* \*